United States Patent
Chang

(10) Patent No.: US 10,637,503 B2
(45) Date of Patent: Apr. 28, 2020

(54) SYSTEMS AND METHODS FOR DECODING LOW DENSITY PARITY CHECK ENCODED CODEWORDS

(71) Applicant: NYQUIST SEMICONDUCTOR LIMITED, Grand Cayman (KY)

(72) Inventor: Yuan-Mao Chang, Hsinchu (TW)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 88 days.

(21) Appl. No.: 16/054,661

(22) Filed: Aug. 3, 2018

(65) Prior Publication Data

US 2020/0044666 A1   Feb. 6, 2020

(51) Int. Cl.
| H03M 13/11 | (2006.01) |
| H03M 13/15 | (2006.01) |
| H04L 1/00 | (2006.01) |
| H04L 27/20 | (2006.01) |
| H03M 13/00 | (2006.01) |

(52) U.S. Cl.
CPC ...... *H03M 13/116* (2013.01); *H03M 13/1131* (2013.01); *H03M 13/155* (2013.01); *H03M 13/618* (2013.01); *H03M 13/6325* (2013.01); *H04L 1/005* (2013.01); *H04L 1/0058* (2013.01); *H04L 27/20* (2013.01)

(58) Field of Classification Search
CPC ........... H03M 13/116; H03M 13/1131; H03M 13/6325; H03M 13/155; H03M 13/618; H04L 1/005; H04L 1/0058; H04L 27/20
USPC ................................ 714/758, 752, 786, 790
See application file for complete search history.

(56) References Cited

U.S. PATENT DOCUMENTS

| 2004/0064782 A1* | 4/2004 | Lerner | H03M 13/2757 |
| | | | 714/800 |
| 2008/0232589 A1* | 9/2008 | Chamberlain | H04K 1/00 |
| | | | 380/275 |
| 2009/0307566 A1* | 12/2009 | No | H03M 13/1105 |
| | | | 714/784 |
| 2011/0029756 A1* | 2/2011 | Biscondi | H03M 13/1114 |
| | | | 712/22 |
| 2011/0170644 A1* | 7/2011 | Iqbal | H04L 7/0337 |
| | | | 375/355 |
| 2011/0320902 A1* | 12/2011 | Gunnam | H03M 13/1128 |
| | | | 714/752 |
| 2013/0013983 A1* | 1/2013 | Livshitz | H03M 13/1111 |
| | | | 714/776 |
| 2015/0163060 A1* | 6/2015 | Tomlinson | H04L 9/304 |
| | | | 380/30 |

(Continued)

*Primary Examiner* — John J Tabone, Jr.
(74) *Attorney, Agent, or Firm* — Metis IP LLC

(57) ABSTRACT

The present disclosure relates to methods and systems for decoding a low density parity check (LDPC) encoded codeword. The methods may include receiving a codeword over a data channel. The codeword may be encoded with a preset number of data bits having one or more shortened data bits. The methods may also include obtaining a parity check matrix that defines relationships between a plurality of variable nodes and a plurality of check nodes. The methods may further include decoding the codeword by iteratively estimating values with respect to the codeword at the plurality of variable nodes and the plurality of check nodes. During each iteration, a same part of the plurality of variable nodes related to one or more shortened data bits are skipped from estimation.

20 Claims, 10 Drawing Sheets

(56) References Cited

U.S. PATENT DOCUMENTS

2018/0358984 A1* 12/2018 Richardson ........ H03M 13/1168
2018/0367245 A1* 12/2018 Soriaga ................ H04L 1/0041
2019/0013900 A1*  1/2019 Patel .................... H04L 1/1819

* cited by examiner

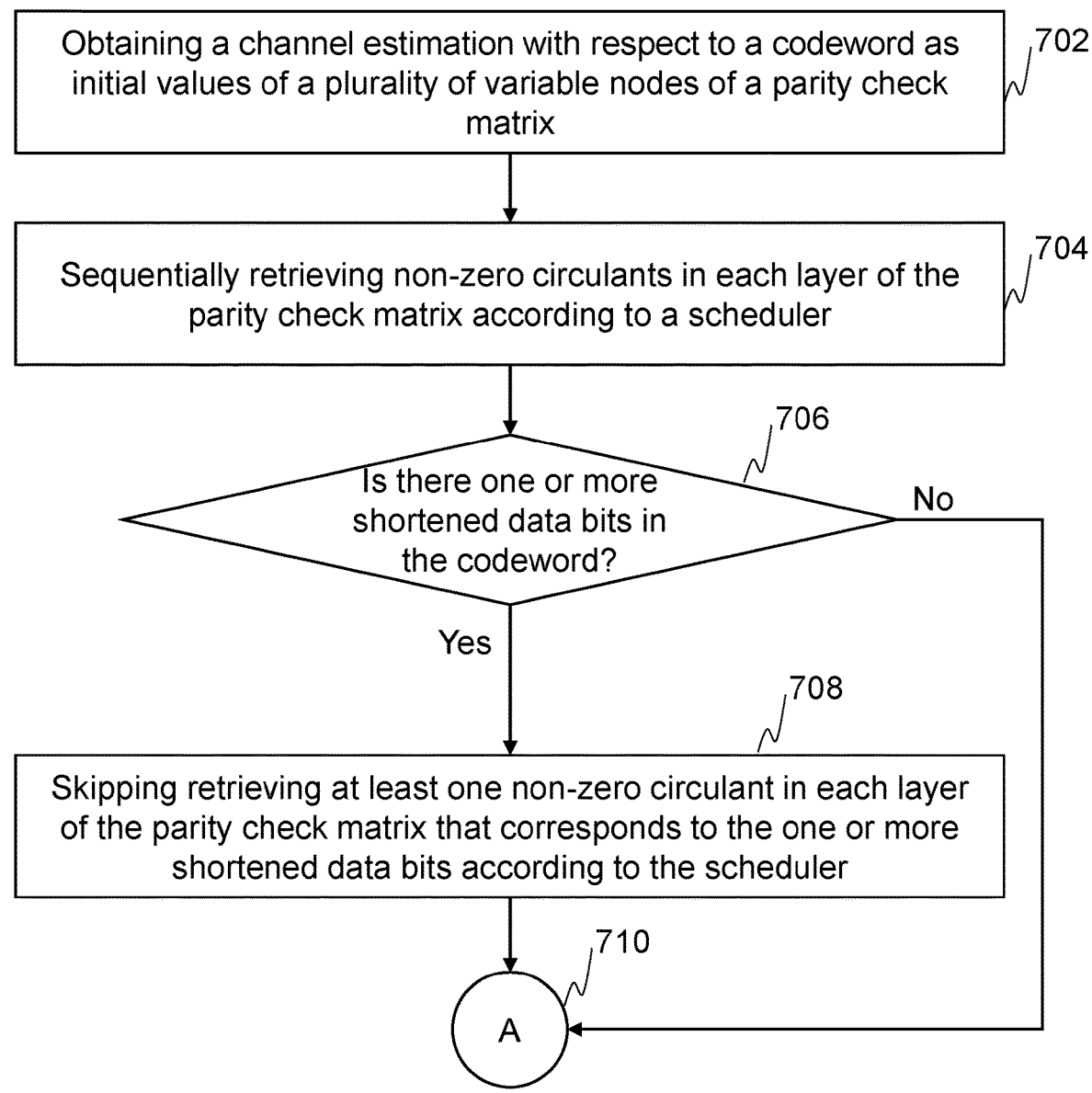
FIG. 7-A

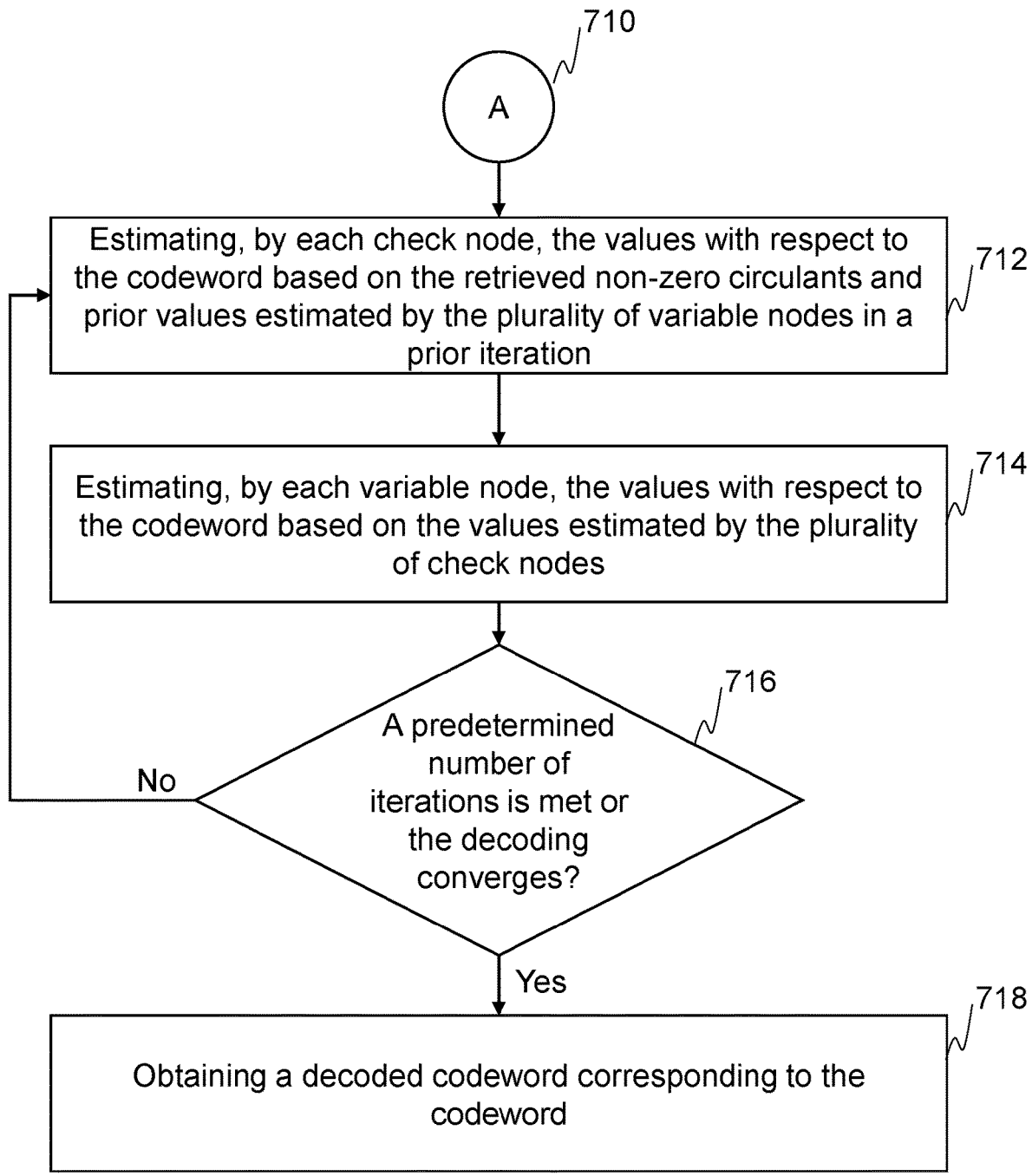
FIG. 7-B

SYSTEMS AND METHODS FOR DECODING LOW DENSITY PARITY CHECK ENCODED CODEWORDS

TECHNICAL FIELD

The present disclosure generally relates to systems and methods for decoding codewords, and more specifically, to systems and methods for decoding a low density parity check (LDPC) encoded codeword having one or more shortened data bits.

BACKGROUND

Generally, an LDPC decoder may decode an LDPC encoded codeword using a parity check matrix. The LDPC encoded codeword may include a number of user bits and a number of parity bits. A decoding throughput of the LDPC decoder is positively associated with the number of circulants of the parity check matrix corresponding to the number of effective user bits in the codeword, the operating frequency of the LDPC decoder, etc. When the number of user bits include one or more shortened data bits (e.g., the data bits that correspond to invalid information or void information), the number of effective user bits in the codeword decreases. Accordingly, the decoding throughput may decrease. Thus, it is desirable to provide systems and methods for decoding an LDPC encoded codeword having one or more shortened data bits, in which the decrease of the decoding throughput caused by the one or more shortened data bits may be recovered.

SUMMARY

According to an aspect of the present disclosure, a method for decoding a low density parity check (LDPC) encoded codeword is provided. The method may include receiving a codeword over a data channel. The codeword may be encoded with a preset number of data bits having one or more shortened data bits. The method may also include obtaining a parity check matrix that defines relationships between a plurality of variable nodes and a plurality of check nodes. Each variable node may correspond to one of the preset number of data bits. The method may further include decoding the codeword by iteratively estimating values with respect to the codeword at the plurality of variable nodes and the plurality of check nodes. During each iteration, a same part of the plurality of variable nodes related to one or more shortened data bits are skipped from estimation.

In some embodiments, the parity check matrix may include a plurality of layers, each of which corresponds to one or more of the plurality of check nodes and having a plurality of non-zero circulants.

In some embodiments, the method may also include storing a first value indicating a first number of non-zero circulants in each layer of the parity check matrix in a scheduler for decoding the codeword, and storing a second value indicating a second number of non-zero circulants in each layer of the parity check matrix in the scheduler. The second number of non-zero circulants may correspond to the one or more shortened data bits.

In some embodiments, the method may also include sequentially retrieving the non-zero circulants in each layer of the parity check matrix based on the first value of the scheduler, and skipping retrieving the second number of non-zero circulants in each layer of the parity check matrix based on the second value of the scheduler.

In some embodiments, the method may also include storing a third value indicating a third number of non-zero circulants in each layer of the parity check matrix in the scheduler. Each of the third number of non-zero circulants may correspond to one or more variable nodes that are estimated during each iteration.

In some embodiments, the method may also include sequentially retrieving the non-zero circulants in each layer of the parity check matrix based on the third value of the scheduler.

In some embodiments, the method may also include sequentially retrieving the non-zero circulants in each layer of the parity check matrix, skipping retrieving at least one non-zero circulant in each layer of the parity check matrix that corresponds to the one or more shortened data bits, and iteratively updating, by the plurality of variable nodes and the plurality of check nodes, the values with respect to the codeword until a predetermined number of iterations is met or the decoded codeword converges.

In some embodiments, the method may also include obtaining a channel estimation with respect to the codeword as initial values of the plurality of variable nodes before executing the iterations.

In some embodiments, the values with respect to the codeword estimated by the plurality of variable nodes and the plurality of check nodes may be iteratively updated according to a scheduler that indicates the amount of non-zero circulants in each layer of the parity check matrix.

In some embodiments, the scheduler may further indicate the amount of non-zero circulants in each layer of the parity check matrix that correspond to the skipped variable nodes.

In some embodiments, the each of the one or more shortened data bits may be assigned with zero in the codeword.

In some embodiments, the each of the one or more shortened data bits may be assigned with one in the codeword.

In some embodiments, during each iteration, each variable node from the same part of the plurality of variable nodes that corresponds to a non-zero circulant in a layer of the parity check matrix may be assigned with a constant value.

According to another aspect of the present disclosure, a decoder for decoding a low density parity check (LDPC) encoded codeword is provided. The decoder may include a receiving module configured to receive a codeword over a data channel. The codeword may be encoded with a preset number of data bits having one or more shortened data bits. The decoder may also include a memory and an updater. The updater may obtain a parity check matrix from the memory. The parity check matrix may define relationships between a plurality of variable nodes and a plurality of check nodes, each variable node corresponding to one of the preset number of bits. The updater may also decode the codeword by iteratively estimating values with respect to the codeword at the plurality of variable nodes and the plurality of check nodes. During each iteration, a same part of the plurality of variable nodes related to one or more shortened data bits may be skipped from estimation.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 7-A and FIG. 7-B illustrate a flowchart illustrating an exemplary process for decoding a codeword according to some embodiments of the present disclosure;

DETAILED DESCRIPTION

Figure 1:
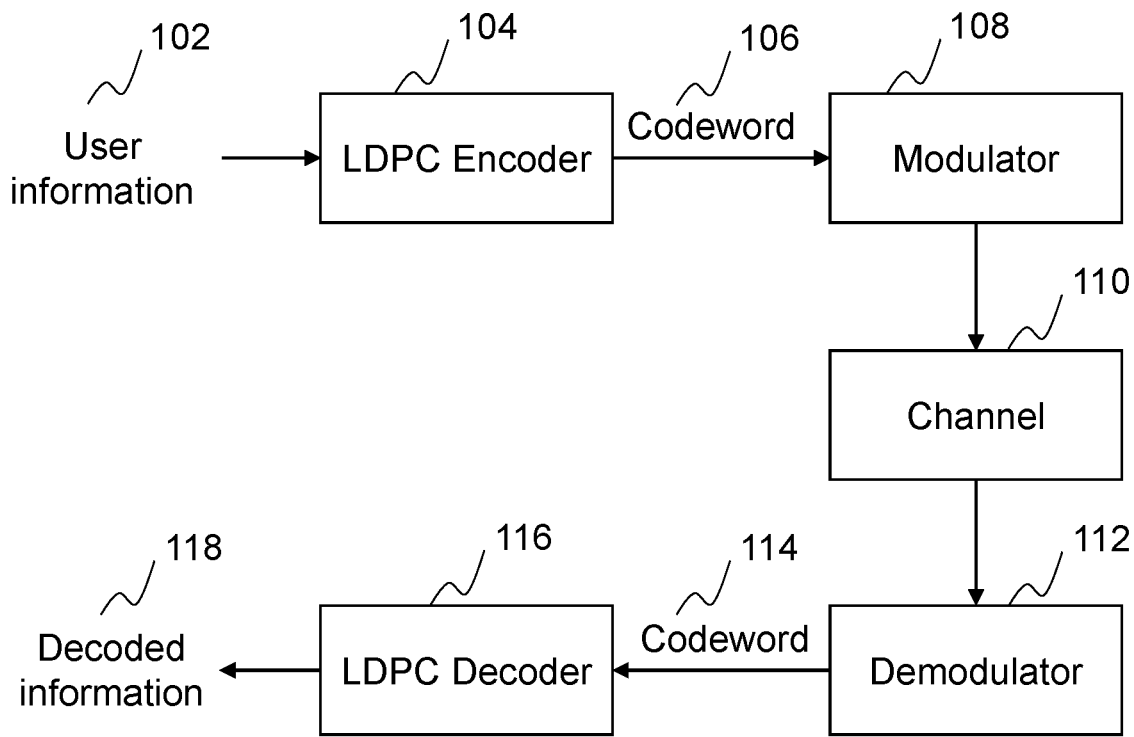
FIG. 1 is a schematic diagram illustrating an exemplary communication system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular exemplary embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," and/or "module" used herein are one method to distinguish different components, elements, parts, section or assembly of different level in ascending order. However, the terms may be displaced by another expression if they achieve the same purpose.

It will be understood that when a unit, engine or module is referred to as being "on," "connected to," or "coupled to," another unit, engine, or module, it may be directly on, connected or coupled to, or communicate with the other unit, engine, or module, or an intervening unit, engine, or module may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of the present disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

An aspect of the present disclosure relates to systems and methods for decoding an LDPC encoded codeword having one or more shortened data bits. With the systems and methods disclosed in the present disclosure, an LDPC decoder may decode the LDPC encoded codeword using a parity check matrix. During each iteration of the decoding, the systems and the methods may skip the processing of non-zero circulants in each layer of the parity check matrix that correspond to the one or more shortened data bits. The systems and the methods may perform the skipping operation according to a scheduler of the LDPC decoder. The scheduler may store information indicating such as the order of processing non-zero circulants in each layer of the parity check matrix, the number of non-zero circulants in each layer of the parity check matrix, the number of non-zero circulants in each layer of the parity check matrix that correspond to the one or more shortened data bits, etc. By performing the skipping operation, the decrease of the decoding throughput of the LDPC decoder caused by the one or more shortened data bits may be recovered.

FIG. 1 is a schematic diagram illustrating an exemplary communication system 100 according to some embodiments of the present disclosure. As illustrated in FIG. 1, the communication system 100 may include an LDPC encoder 104, a modulator 108, a channel 110, a demodulator 112, and an LDPC decoder 116.

The LDPC encoder 104 may encode user information 102 to generate a codeword 106. The user information 102 may include K bits of data, each of which may be referred to as a user bit. Each bit of the user information 102 may be a binary bit, a decimal bit, a hexadecimal bit, or any other suitable type of data. For brevity, the methods and/or systems described in the present disclosure may take a binary bit as an example. It should be noted that the binary bit is merely provided for the purposes of illustration, and not intended to limit the scope of the present disclosure. For persons having ordinary skills in the art, the methods and/or systems described in the present disclosure may be applied to other similar situations, such as a decimal bit, a hexadecimal bit, etc. The codeword 106 may be a block code encoded with N data bits. The LDPC encoder 104 may add P (P=N−K, N>K) redundant bits to the K user bits to generate the N data bits of the codeword 106, where N and K are appropriate positive integers. In the codeword 106, P redundant bits are added to the end of the K user bits. The term "redundant bit," "parity bit," and "check bit" in the present disclosure are used interchangeably to refer to a bit that is used to detect and correct errors in the codeword (e.g., a codeword 114) received at the receiver side of the communication system 100 (e.g., the demodulator 112, the LDPC decoder 116). A code rate denoted by R is defined as the ratio between K and N (i.e., R=K/N). For example, for 60 user bits and for 105 data bits (i.e., K=60, N=105), the code rate R is 4/7, which means that for every 4 user bits, the LDPC encoder 104 generates 7 data bits, of which 3 bits are redundant.

The LDPC encoder 104 may encode the user information 102 using an LDPC code. The LDPC code may be represented mathematically as a two-dimensional matrix called a generator matrix G. Each entry in the generator matrix may be either one or zero. For example, if the user information 102 is represented as a one-dimensional vector u of K user bits, and the codeword 106 is encoded with N data bits. The generator matrix G may be a K-by-N matrix. The codeword 106 may be represented as a one-dimensional vector c, which is described as c=uG.

The modulator 108 may modulate the codeword 106 into one or more signals carrying the information of the codeword 106. Exemplary modulation technologies may include a phase-shift keying (PSK) technology, a binary PSK (BPSK) technology, a frequency-shift keying (FSK) modulation technology, a quadrature amplitude modulation technology, or the like, or any combination thereof.

The channel 110 may facilitate transmission of information and/or data. The one or more signals generated by the modulator 108 may be transmitted over the channel 110. The channel 110 may include a wired channel and/or a wireless channel. The wired channel may be a medium such as a twisted-pair wire, a cable (e.g., a coaxial cable, a symmetrical cable), a telephone wire, an optical fiber, a waveguide, an optical disk, a magnetic disk, a solid state disk, etc. The wireless channel may be a medium such as a microwave signal (e.g., an RF signal, an infrared signal). Due to interference signals and other types of noise and phenomena (e.g., a device physical failure, a device electrical failure, a data loss due to buffer overflow, channel degradation), the channel 110 may corrupt the one or more signals transmitted from the modulator 108. Thus, the signals received by the demodulator 112 may be different from the originally transmitted signals from the modulator 108. In some embodiments, the channel 110 may also include the modulator 108 and/or the demodulator 112.

The demodulator 112 may demodulate signals received from the channel 110 into the codeword 114. The demodulator 112 may demodulate the signals according to a demodulation technology corresponding to the modulation technology used in the modulator 108. For example, if the modulator 108 modulates the codeword 106 based on a PSK modulation technology, the demodulator 112 may demodulate the signals received based on a PSK demodulation technology. In some embodiments, the codeword 114 may be different from the codeword 106 and may include bit errors introduced by, for example, degradations of the channel 110. As used herein, the term "error" may refer to portions of information that have been altered or lost. For example, a data bit in the codeword 114 may be an erroneous bit if the bit value is different from that of the corresponding bit in the codeword 106, or the bit value is unknown. In some embodiments, the demodulator 112 may calculate and determine a plurality of values with respect to the data bits of the codeword 114. Each value may indicate the likelihood that the corresponding data bit is zero and/or the likelihood that the corresponding data bit is one. The values may be represented in various ways, such as an absolute value, a probability value, an LLR value, etc. The demodulator 112 may transmit the codeword 114 along with the plurality of values to the LDPC decoder 116 for correcting errors in the codeword 114.

The LDPC decoder 116 may decode the codeword 114 received from the demodulator 112. The LDPC decoder 116 may detect and correct errors in the codeword 114. In some embodiments, the LDPC decoder 116 may use an LDPC decoding algorithm to correct or detect the errors in the codeword 114. Exemplary LDPC decoding algorithm may include an iterative message-passing algorithm, a min-sum algorithm, a bit flipping algorithm, a stochastic decoding algorithm, a layered decoding algorithm, etc. The LDPC decoder 116 may decode the codeword 114 to generate decoded information 118, which may or may not include errors. If there are no errors in the decoded information 118, the decoded information 118 may be the same as the user information 102. Otherwise, the decoded information 118 may be different from the user information 102.

In some embodiments, the LDPC decoder 116 may decode the codeword 114 using an LDPC code. The LDPC code may be represented mathematically as a two-dimensional matrix called a parity check matrix. The parity check matrix may define a plurality of nodes (variable nodes and check nodes). The decoding process may be an iterative message-passing process, in which values with respect to the data bits of the codeword may be estimated by a plurality of variable nodes and check nodes and passed between the corresponding variable nodes and check nodes. The values at the plurality of variable nodes and check nodes are updated iteratively during this process. The values with respect to the data bits of the codeword may indicate the likelihood that each data bit is zero and/or the likelihood that each data bit is one. Detailed descriptions of the decoding of the LDPC decoder 116 may be found elsewhere in the present disclosure (e.g., FIG. 2, FIG. 5, FIG. 6, FIG. 7-A and/or FIG. 7-B and the descriptions thereof).

It should be noted that above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, the application scenario illustrated in FIG. 1 is only provided for illustration purposes, and not intended to limit the scope of the present disclosure. For example, the communication system 100 may be used as a data storage system. The data storage system may include a data source (e.g., the LDPC encoder 104, and/or the modulator 108), a data destination (e.g., the LDPC decoder 116, and/or the demodulator 112), and a storage medium (the channel 110). Data from the data source may be stored in the storage medium, and then retrieved in the data destination. The data storage system may correct errors introduced by for example, the storage medium, according to the process and/or method described in the present disclosure. In some embodiments, the modulator 108 and/or the demodulator 112 may be integrated into the channel 110.

Figure 2:
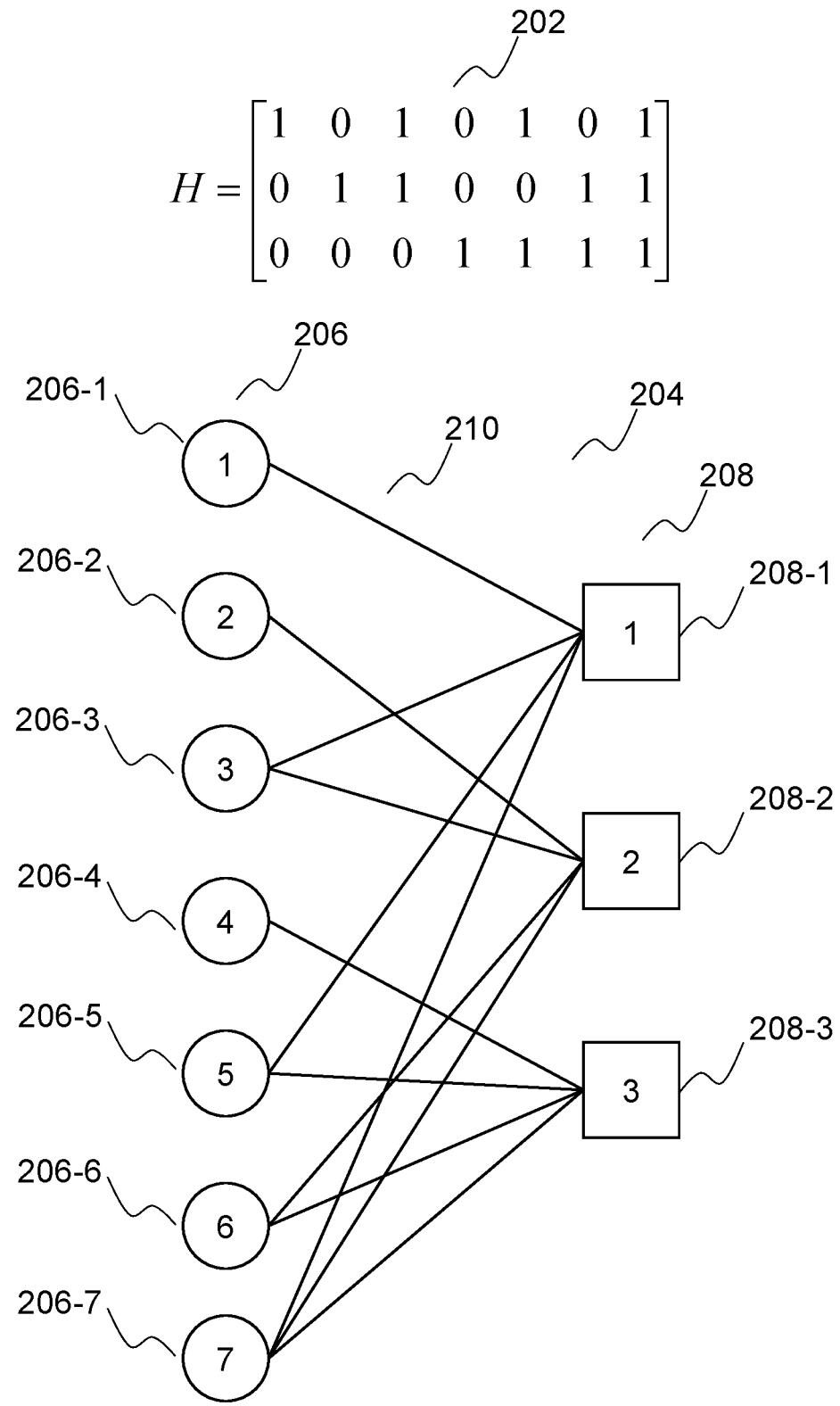
FIG. 2 is a schematic diagram illustrating an exemplary LDPC code according to some embodiments of the present disclosure.

FIG. 2 is a schematic diagram illustrating an exemplary LDPC code according to some embodiments of the present disclosure. The LDPC code may be represented as an LDPC code matrix 202 and as a corresponding Tanner graph 204. The LDPC code matrix 202 may include a plurality of rows and a plurality of columns. Each row of the LDPC code matrix 202 may correspond to a parity check equation that is used to encode or decode a specific codeword. The number of columns in the LDPC code matrix 202 may be identical to the number of data bits in the specific codeword. For example, as illustrated in FIG. 2, the LDPC code matrix 202 includes three rows and seven columns. The LDPC matrix 202 may be used to encode or decode a codeword having seven data bits, among which four data bits may be user bits and the other three data bits may be parity check bits. The elements of the LDPC code matrix 202, each of which corresponds to a single row and a single column, are binary. The value of each of the elements is either zero or one.

As illustrated in the Tanner graph 204, the LDPC code may define a plurality of nodes. The Tanner graph 204 may include a plurality of variable nodes 206 and a plurality of check nodes 208. The plurality of variable nodes 206, including variable node 206-1, variable node 206-2, . . . , variable node 206-7, may correspond respectively to column 1, column 2, . . . , column 7 of the LDPC code matrix 202. The plurality of check nodes 208, including check node 208-1, check node 208-2, and check node 208-3, may correspond respectively to row 1, row 2, and row 3 of the LDPC code matrix 202. The edges 210 may connect each of the plurality of variable nodes 206 to one or more check nodes 208. The edges 210 may also connect each of the plurality of check nodes 208 to one or more variable nodes 206. The edges 210 may correspond to elements of the LDPC code matrix 202 that have value as ones. For each element having value one at a particular row and column in the LDPC code matrix 202, the corresponding variable node and check node are connected by one of the edges 210. For example, the value of the element at row 1 and column 1 is one, thus one of the edges 210 may connect the variable node 206-1 (corresponding to column 1 of the LDPC code matrix 202) and the check node 208-1 (corresponding to row 1 of the LDPC code matrix 202).

The LDPC code matrix 202 may also be referred as a parity check matrix H, which may be used to decode a codeword. Each row of the parity check matrix H may correspond to a parity check equation. The codeword (e.g., the codeword 114) received by the LDPC decoder 116 may be represented as a one-dimensional vector r, a syndrome of the codeword S may be defined according to S=Hr. When S is a null matrix (i.e., S=0), the codeword r is a valid codeword. For example, the codeword r may be encoded with seven data bits including four user bits and three parity bits. The syndrome S may be a three-by-one matrix. The LDPC decoder 116 may decode the codeword r by correcting errors in the codeword r and making S a null matrix.

Generally, the process of decoding the codeword may be illustrated with reference to the Tanner graph 204. For example, the codeword may include seven data bits, corresponding to the seven variable nodes 206-1 through 206-7. Initially, each variable node 206 may be assigned an initial value with respect to corresponding data bit of the codeword according to the output of the demodulator 112. An initial value (or a value) may indicate the likelihood that each data bit of the codeword is zero and/or the likelihood that each data bit of the codeword is one. The initial value may be generated by channel estimation. The initial value may be represented in various ways, such as an absolute value, a probability value, an LLR value, etc. Each variable node 206 may send the corresponding initial value to its edge-connected check nodes 208. In response, each check nodes 208 may estimate and send values back to its edge-connected variable nodes 206. A check node may estimate a value regarding a particular variable node based on most recent values received from other variable nodes and the parity check equation corresponding to the check node. In the next iteration, each variable node 206 may then estimate an updated value based on values received from its edge-connected check nodes and the initial value. The updated value of a variable node may be passed to one or more corresponding check nodes to compute. The updated value of a variable node may be further saved locally for the estimation in the subsequent iterations. The LDPC decoder 116 may then determine the most-likely bit values at the variable nodes 206 (i.e., the most-likely bit values for data bits of the codeword corresponding to the variable nodes 206) based on the updated values. If all the parity check equations corresponding to the check nodes 208 are satisfied (i.e., the syndrome of the codeword S is a null matrix), or if a predetermined number of iterations is met, the decoding process may terminate and the LDPC decoder 116 may generate a decoded codeword (e.g., the decoded information 118 illustrated in FIG. 1). If any one of the parity check equations corresponding to the check nodes 208 is not satisfied (i.e., the syndrome of the code S is not a null matrix), or if the predetermined number of iterations is not met, the decoding process described above iterates, with the variable nodes 206 and check nodes 208 exchanging and updating values. The final bit values at the variable nodes 206 may indicate the corresponding bit values of data bits of the decoded codeword.

Figure 3:
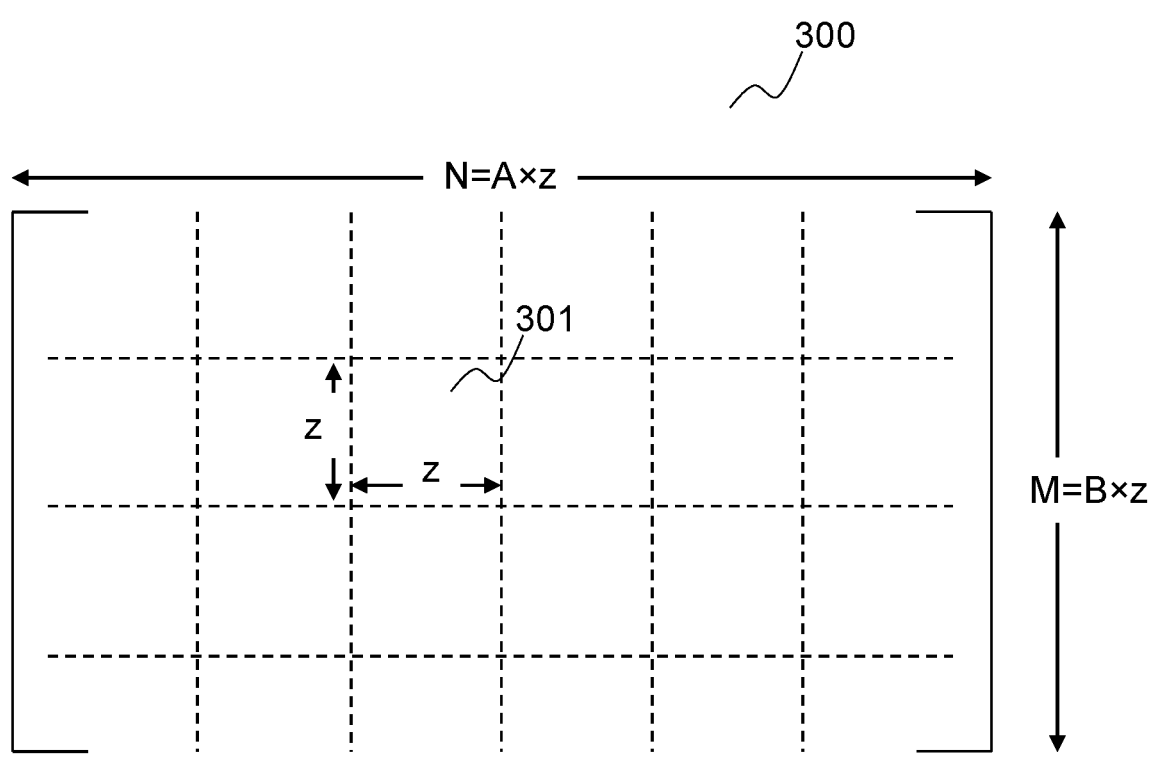
FIG. 3 is a schematic diagram illustrating an exemplary LDPC code matrix according to some embodiments of the present disclosure.

FIG. 3 is a schematic diagram illustrating an exemplary LDPC code matrix 300 according to some embodiments of the present disclosure. As illustrated in FIG. 3, the LDPC code matrix 300 may include M rows and N columns. M and N are appropriate positive integers. In some embodiments, the LDPC code matrix 300 may be a sparse binary parity check matrix, in which the value corresponding to each of the elements is zero or one. In some embodiments, the LDPC code matrix 300 may be used to decode and/or encode information. For example, the LDPC decoder 116 may use the LDPC code matrix 300 to decode a codeword.

The LDPC code matrix 300 may be divided in A by B subdivisions (illustrated using dotted lines in FIG. 3). A and B are appropriate positive integers. The LDPC code matrix 300 may include a plurality of subdivisions 301. A subdivision 301 of the LDPC code matrix 300 may be referred to as a circulant of the LDPC code matrix 300. A circulant may be a square matrix of dimension z by z, i.e., the circulant includes z rows and z columns. A circulant size of each circulant is defined as z. The number of columns N of the LDPC code matrix 300 may be given by multiplying A by z, and the number of rows M of the LDPC code matrix 300 may be given by multiplying B by z. In some embodiments, a circulant with all elements being zero may be referred to as a zero-circulant. A circulant with one or more elements being one may be referred to as a non-zero circulant. A length of a circulant is defined as the number of elements being one in the circulant. In some embodiments, a non-zero circulant of the LDPC code matrix 800 may be generated based on performing a c (c is smaller than z) positions circular shift (e.g., circular right-shift, circular left-shift) on a diagonal matrix in which elements in the main diagonal are all one.

Figure 4:
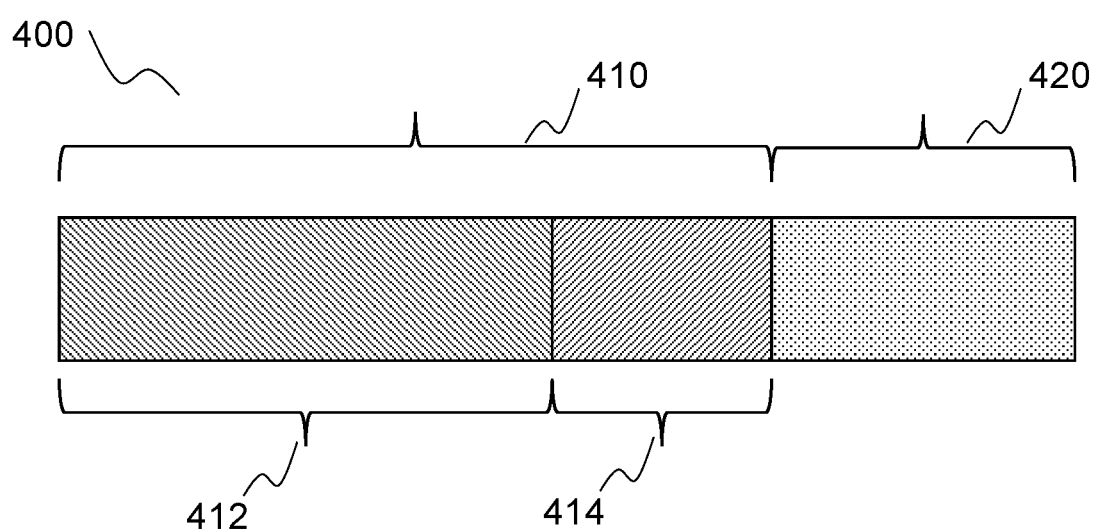
FIG. 4 is a schematic diagram illustrating an exemplary codeword according to some embodiments of the present disclosure.

FIG. 4 is a schematic diagram illustrating an exemplary codeword 400 according to some embodiments of the present disclosure. The codeword 400 may include the codeword 106 output from the LDPC encoder 104, the codeword 114 output from the demodulator 112, etc. The codeword 400 may be encoded by the LDPC encoder 104. For example, as illustrated in FIG. 4, the codeword 400 may be encoded with a first preset number of user bits 410 and a second preset number of parity bits 420. In some embodiments, the first preset number of user bits 410 may include a first portion of bits corresponding to the user information and a second portion of bits corresponding to non-user information. The bits corresponding to the user information may be referred to as non-shortened data bits that have valid user information desired to be transmitted. The bit corresponding to non-user information may be referred to as a shortened data bit that corresponds to invalid information or void information. The shortened codeword may be generated if the number of the non-shortened user bits is less than the first preset number. For example, as illustrated in FIG. 4, the first preset number of user bits 410 may include one or more non-shortened data bits 412 and one or more shortened data bits 414. During the encoding of the LDPC encoder 104, each shortened data bit may be assigned with a specific value. For example, all the shortened data bits may be assigned with zeros. As another example, all the shortened data bits may be assigned with ones.

Figure 5:
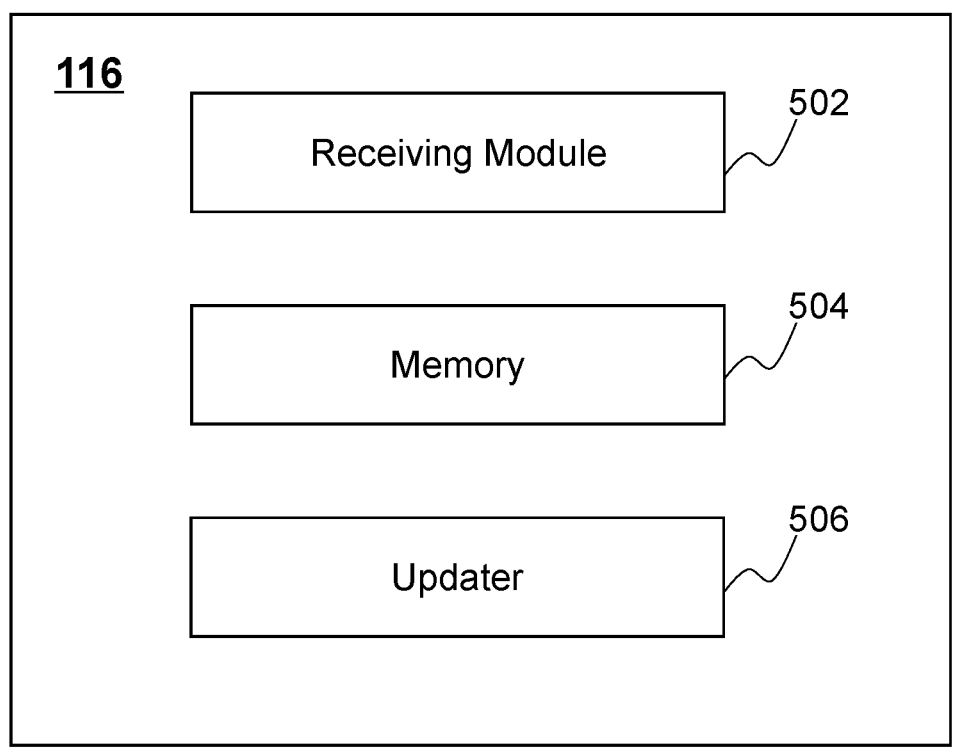
FIG. 5 is a block diagram illustrating an exemplary LDPC decoder according to some embodiments of the present disclosure.

FIG. 5 is a block diagram illustrating an exemplary LDPC decoder 116 according to some embodiments of the present disclosure. As illustrated in FIG. 5, the LDPC decoder 116 may include a receiving module 502, a memory 504, and an updater 506.

The receiving module 502 may receive a codeword over a data channel. The codeword (e.g., the codeword 114) may be encoded with a preset number of data bits having one or more shortened data bits.

The memory 504 may store various information regarding an encoding or decoding process. For example, the memory 504 may store a parity check matrix, such as an LDPC code matrix that defines relationships between a plurality of variable nodes and a plurality of check nodes. In addition, the memory 505 may further store information related to one or more elements in the parity check matrix. For example, the memory 505 may store an end-of-layer flag indicating the position of a non-zero circulant in the parity check matrix. As a further example, the memory 504 may store a scheduler that indicates the sequence of the elements in the parity check matrix to be processed and the number of non-zero circulants corresponding to shortened data bits, non-shortened data bits and/or parity bits in a codeword.

The updater 506 may estimate the values with respect to a codeword based on a parity check matrix. For example, the updater 506 may estimate the values with respect to the codeword by updating the values of a plurality of check nodes according to the values of a plurality of variable nodes associated with the parity check matrix. In addition, the updater 506 may estimate the values with respect to the codeword by updating the values of a plurality of variable nodes according to the values of a plurality of check nodes associated with the parity check matrix. In some embodiments, the updater 506 may include one or more processing engines (e.g., single-core processing engine(s) or multi-core processor(s)). Merely by way of example, the updater 506 may include one or more hardware processors, such as a central processing unit (CPU), an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction-set computer (RISC), a microprocessor, or the like, or any combination thereof.

The components in the LDPC decoder 116 may be connected to or communicate with each via a wired connection or a wireless connection. The wired connection may include a metal cable, an optical cable, a hybrid cable, or the like, or any combination thereof. In some embodiments, the wired connection may be achieved via a storage device, in which case different components in the LDPC decoder 116 may be connected to the storage device respectively, and exchange information through the storage device. The wireless connection may include a Local Area Network (LAN), a Wide Area Network (WAN), a Bluetooth™, a ZigBee™, a Near Field Communication (NFC), or the like, or any combination thereof.

Figure 6:
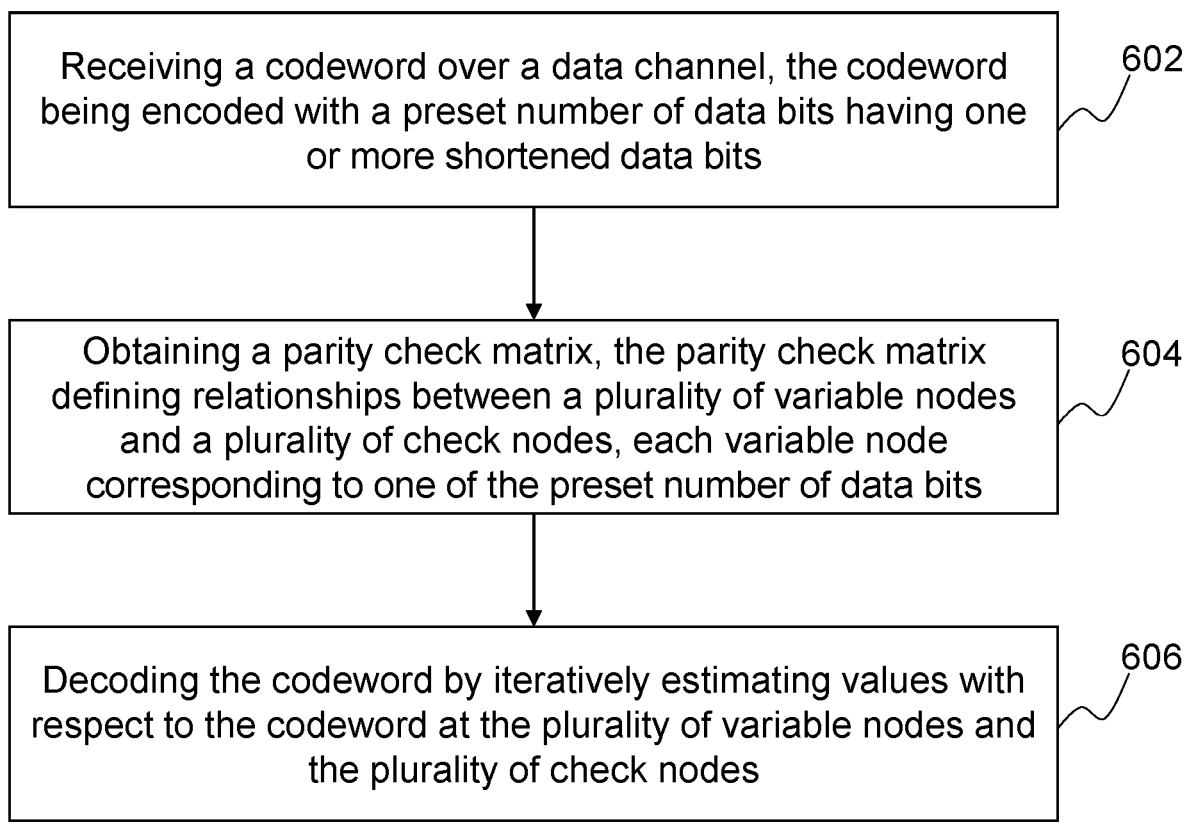
FIG. 6 is a flowchart illustrating an exemplary process for decoding a codeword according to some embodiments of the present disclosure.

FIG. 6 is a flowchart illustrating an exemplary process 600 for decoding a codeword according to some embodiments of the present disclosure. The process 600 may be executed by the communication system 100. For example, the process 600 may be implemented by the LDPC decoder 116.

In 602, the LDPC decoder 116 (e.g., the receiving module 502) may receive a codeword over a data channel. The codeword (e.g., the codeword 114) may be encoded with a preset number of data bits having one or more shortened data bits. For example, the codeword may be encoded by the LDPC encoder 104 with a first preset number of user bits and a second preset number of parity bits. The first preset number of user bits may include one or more non-shortened data bits and one or more shortened data bits. During the encoding of the LDPC encoder 104, each shortened data bit may be assigned with a specific value. For example, all the shortened data bits may be assigned with zeros. As another example, all the shortened data bits may be assigned with ones. More descriptions of the shortened data bits may be found elsewhere in the present disclosure (e.g., FIG. 4 and the description thereof). The data channel may include a wired communication channel (e.g., wires, fiber optic cables), a wireless channel, or a storage device (e.g., a magnetic disk, an optical disk, etc.), etc. In some embodiments, the data channel may be the channel 110. For example, the LDPC decoder 116 may receive the codeword (e.g., the codeword 114) over the channel 110 after demodulation of the demodulator 112. In some embodiments, the codeword may include one or more potentially erroneous bit errors that are introduced by degradations and/or data corruption of the data channel. The LDPC decoder 116 may decode the codeword and correct the bit errors in the codeword.

In 604, the LDPC decoder 116 (e.g., the updater 506) may obtain a parity check matrix. In some embodiments, the LDPC decoder 116 may obtain the parity check matrix from the memory 504 of the LDPC decoder 116. The parity check matrix may be an LDPC code matrix. The parity check matrix may define relationships between a plurality of variable nodes and a plurality of check nodes. Each variable node may correspond to one of the preset number of data bits in the codeword received in operation 602, and may correspond to a column of the parity check matrix. Each check node may correspond to a row of the parity check matrix. The number of check nodes may correspond to the number of parity bits in the codeword. For example, the LDPC code matrix 202 (as shown in FIG. 2) may be an exemplary parity check matrix. The LDPC code matrix 202 is a three-by-seven matrix that may correspond to the Tanner graph 204 (as shown in FIG. 2) including seven variable nodes 206 and three check nodes 208. Accordingly, the codeword received in operation 602 may be a codeword of seven data bits including four user bits and three parity bits.

Figure 8:
FIG. 8 is a schematic diagram illustrating an exemplary LDPC code matrix according to some embodiments of the present disclosure.

In some embodiments, the parity check matrix may include a plurality of layers. A layer of the parity check matrix may refer to a row of circulants of the parity check matrix including a plurality of non-zero circulants and/or a plurality of zero circulants. A layer of the parity check matrix may correspond to one or more of single rows of the parity check matrix. In other words, a layer of the parity check matrix may correspond to one or more of the plurality of check nodes of the parity check matrix. For example, FIG. 8 is a schematic diagram illustrating an exemplary LDPC code matrix 800 according to some embodiments of the present disclosure. The LDPC code matrix 800 may be an exemplary parity check matrix, each element of the LDPC code matrix 800 being either zero or one. The LDPC code matrix 800 may be divided into a plurality of subdivisions, each corresponding to a circulant. As shown in FIG. 8, the LDPC code matrix 800 may be divided into five by eight subdivisions including forty circulants. The LDPC code matrix 800 may be partitioned into five layers, each layer including eight circulants. A circulant illustrated by $P(i,j)$ ($i=1, 2, \ldots, 5$; $j=1, 2, \ldots, 8$) may refer to a non-zero circulant in row i (i.e., layer i) and column j of the LDPC code matrix 800. For example, $P(1, 6)$ may refer to a non-zero circulant in row one and column six of the LDPC code matrix 800. A circulant illustrated by a dash sign "-" may refer to a zero-circulant of the LDPC code matrix 800. Each circulant of the LDPC code matrix 800 may be a square matrix with z rows and z columns, i.e., the circulant size of each circulant is z. z may take an appropriate integer value. Merely by way of example, z may be equal to 10, 20, 25, etc. In some embodiments, a non-zero circulant of the LDPC code matrix 800 may be a diagonal matrix in which all elements in the main diagonal are ones, and other elements are zeros. In some embodiments, a non-zero circulant of the LDPC code matrix 800 may be generated based on performing a c (c is smaller than z) positions circular shift (e.g., circular right-shift, circular left-shift) on a diagonal matrix.

In 606, the LDPC decoder 116 (e.g., the updater 506) may decode the codeword by iteratively estimating values with respect to the codeword at the plurality of variable nodes and the plurality of check nodes. Values with respect to the codeword may include a plurality of values with respect to the data bits of the codeword. A value corresponding to each data bit of the codeword may indicate the likelihood that the each data bit is zero and/or the likelihood that the each data bit is one. The value may be represented in various ways, such as an absolute value, a probability value, an LLR value, etc.

The LDPC decoder 116 may use the parity check matrix to decode the codeword. In some embodiments, the parity check matrix may include a plurality of layers, each having a plurality of non-zero circulants and/or a plurality of zero circulants (e.g., the LDPC code matrix 800 and the circulants illustrated in FIG. 8). During the decoding of the codeword, the LDPC decoder 116 may sequentially process the plurality of layers from the first layer to the last layer. When processing each layer, the LDPC decoder 116 may only process the non-zero circulants in each layer.

In some embodiments, the LDPC decoder 116 may sequentially retrieve the non-zero circulants in each layer of the parity check matrix, and then send values estimated at the plurality of variable nodes corresponding to the retrieved non-zero circulants to the corresponding check nodes in the each layer. In some embodiments, for each non-zero circulant of the parity check matrix, the memory 504 may store an end-of-layer flag indicating that the each non-zero circulant of a layer is processed. The end-of layer flag may consume one or more bits of space. The LDPC decoder 116 may sequentially retrieve the non-zero circulants in each layer of the parity check matrix based on the end-of-layer flag. For example, as illustrated in FIG. 8, the LDPC decoder 116 may retrieve the non-zero circulants in each layer of the LDPC code matrix 800 in the natural column order of one through eight and according to the end-of-layer flags of the non-zero circulants in each layer. For a current processing layer, upon receiving values passed by the plurality of variable nodes corresponding to the retrieved non-zero circulants, the corresponding check nodes may estimate the values for the plurality of variable nodes and send the estimated values back to the plurality of variable nodes. The LDPC decoder 116 may update values at the plurality of variable nodes of the current processing layer based on the estimated values received from the corresponding check nodes. The LDPC decoder 116 may vertically pass the updated values at the plurality of variable nodes from the current processing layer to the next unprocessed layers that belong to the same plurality of variable nodes. In each iteration of processing the layers of the parity check matrix, the LDPC decoder 116 may sequentially process the layers of the parity check matrix from the first layer to the last layer. The iterative decoding of the codeword may terminate until all parity check equations corresponding to the check nodes of the parity check matrix are satisfied by the bit values of the variable nodes (i.e., the syndrome of the codeword S is a null matrix), or until a predetermined number of iterations is met. When the syndrome of the codeword S is a null matrix, the LDPC decoder 116 may obtain a decoded codeword which is a valid codeword, and the decoding converges. The final values of the variable nodes may then indicate the corresponding bit values of the decoded codeword. As used herein, an iteration may refer to a process of processing the parity check matrix from the first layer to the last layer.

For example, as illustrated in FIG. 8, when decoding the codeword using the LDPC code matrix 800, the LDPC decoder 116 may only process the non-zero circulants illustrated by $P(i,j)$ in each layer of the LDPC code matrix 800. The LDPC decoder 116 may sequentially process the five layers of the LDPC code matrix 800 from layer 1 to layer 5. Taking column 6 of the LDPC code matrix 800 for an example, for layer 1, the LDPC decoder 116 may update values at the plurality of variable nodes corresponding to the non-zero circulant $P(1, 6)$ based on estimation from the corresponding check nodes in layer 1. The LDPC decoder 116 may vertically pass the updated values at the plurality of variable nodes corresponding to the non-zero circulant $P(1, 6)$ to the same variable nodes corresponding to the non-zero circulant $P(3, 6)$ in layer 3. When processing layer 3, the LDPC decoder 116 may use the updated values estimated from the circulant $P(1, 6)$ as input to the plurality of variable nodes corresponding to the circulant $P(3, 6)$, and then further update values at the plurality of variable nodes corresponding to the circulant P(3, 6) based on estimation from the corresponding check nodes in layer 3. The LDPC decoder 116 may then vertically pass the newly updated values at the plurality of variable nodes corresponding to the non-zero circulant P(3, 6) to the same variable nodes corresponding to the non-zero circulant P(5, 6) in layer 5.

In some embodiments, a decoding throughput of the LDPC decoder 116 may be described according to Equation (1):

$$\text{Throughput} = \frac{CLK_{freq} * K * Circ_{sz} * Para}{NZCirc * Iter} \quad \text{Equation (1)}$$

where Throughput represents the decoding throughput of the LDPC decoder 116, $CLK_{freq}$ represents a clock frequency of the LDPC decoder 116, K represents the number of circulants of the parity check matrix corresponding to the number of non-shortened data bits in the codeword to be decoded, $Circ_{sz}$ represents the circulant size of a circulant of the parity check matrix, Para represents the number of circulants that the LDPC decoder 116 process at a time, NZCirc represents the number of non-zero circulants of the parity check matrix processed in each iteration during the decoding, and Iter represents the number of iterations of processing the parity check matrix.

When decoding codewords by implementing the above described process, the decoding throughput of the LDPC decoder 116 for a codeword having one or more shortened data bits may decrease compared to the decoding throughput of the LDPC decoder 116 for the codeword without any shortened data bit. The reason is that when the codeword includes one or more shortened data bits, the value of K decreases, and accordingly the value of the decoding throughput Throughput may decrease. Merely by way of example, the value of $CLK_{freq}$ may be 600 MHz, the value of K may be 300, the value of $Circ_{sz}$ may be 16 Byte, the value of Para may be 1, the value of NZCirc may be 1740, and the value of Iter may be 5. When decoding a codeword without any shortened data bit, the decoding throughput of the LDPC decoder 116 is calculated to be 331 MB/s according to Equation (1). When decoding the codeword including about 200 byte of shortened data bits, which corresponds to about 12 circulants of the parity check matrix, the value of K in Equation (1) decreases from 300 to 288. Thus the decoding throughput of the LDPC decoder 116 is calculated to be 317.8 MB/s, which is 4.0% smaller than 331 MB/s.

To recover the drop or decrease of the decoding throughput caused by the shortened data bits, the LDPC decoder 116 may skip the processing of the non-zero circulants corresponding to the one or more shortened data bits, to make the value of NZCirc decrease.

In some embodiments, the memory 504 may include a scheduler. For each layer, the scheduler may store one or more first values. Each first value may indicate a first number (e.g., the total number) of non-zero circulants in each layer of the parity check matrix in the scheduler. For each layer, the scheduler may also store one or more second values. Each second value may indicate a second number of non-zero circulants in each layer of the parity check matrix in the scheduler. The second number of non-zero circulants may correspond to the one or more shortened data bits. For example, each second value may be determined according to a specific value that indicates the number of the one or more shortened data bits (also referred to as "shortened bits number"). In some embodiments the scheduler may store the relationships of the second value and the shortened bits number in the form of, for example, a table. Then, after the shortened bits number with respect to the codeword is determined, the second value may be correspondingly determined according to the table. In some further embodiments, if the shortened bits number is smaller than a threshold (e.g., a positive integer), the second value may be assigned with a constant value (e.g., zero) such that no non-zero circulant corresponding to the one or more shortened data bits is skipped.

Figure 9:
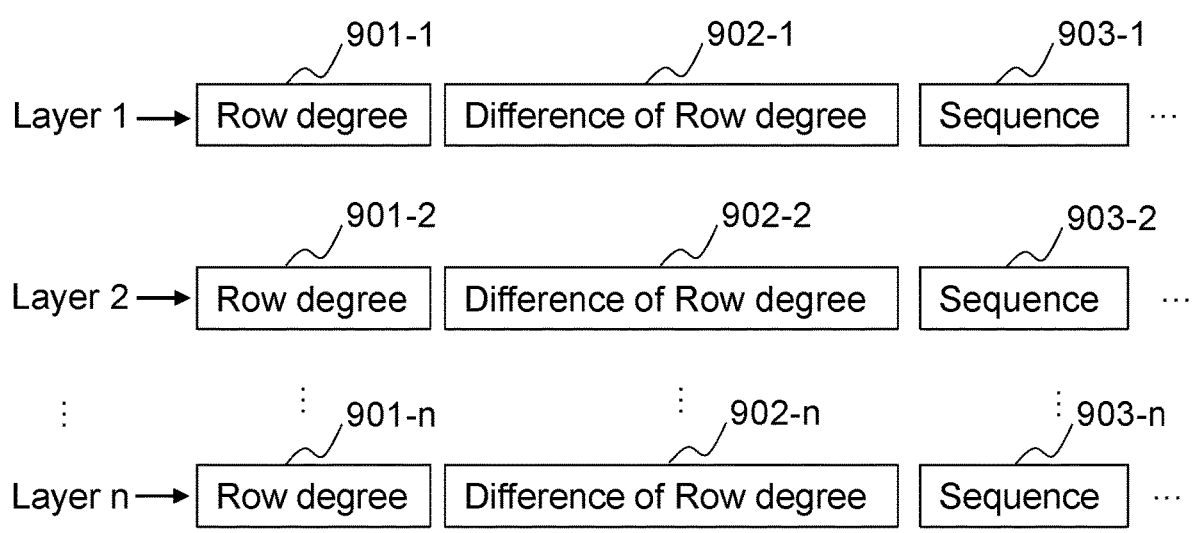
FIG. 9 is a schematic diagram illustrating exemplary information stored in a scheduler according to some embodiments of the present disclosure.

In some embodiments, a first value may also be referred as a row degree, and a second value may also be referred as a difference of row degree. The first value and the second value may respectively consume one or more bits of space. For example, FIG. 9 is a schematic diagram illustrating exemplary information stored in a scheduler according to some embodiments of the present disclosure. As illustrated in FIG. 9, the scheduler may store a plurality of row degrees 901, a plurality of differences of row degree 902, and a plurality of sequences 903. For layer m (m=1, 2, ..., n) of the parity check matrix, the scheduler may store a row degree 901-m, a difference of row degree 902-m, and a sequence 903-m. The sequence 903-m may indicate the order of processing the non-zero circulants in layer m including, for example, the order of retrieving the non-zero circulants in layer m, the order of estimating values at the plurality of variable nodes corresponding to the non-zero circulants in layer m, etc.

Additionally or alternatively, for each layer, the scheduler may store a third value indicating a third number of non-zero circulants in each layer of the parity check matrix in the scheduler. Each of the third number of non-zero circulants may correspond to the one or more variable nodes that perform estimation during each iteration. In some embodiments, the third number may be equal to the number of non-zero circulants to be processed in each layer. The third number of non-circulants may correspond to the one or more non-shortened data bits and the one or more parity bits. Similar to the second value, the scheduler may also store the relationships of the third value and the shortened bits number in the form of a table. After the shortened bits number with respect to the codeword is determined, the third value may be determined accordingly.

In some embodiments, the scheduler may also store information indicating the corresponding relationship between the plurality of variable nodes of the parity check matrix and the corresponding data bits in the codeword. In some embodiments, the scheduler also store position information of the non-zero circulants, for example, the columns of the non-zero circulant in each layer of the parity check matrix. The scheduler may further store information related to circular shift of the non-zero circulants.

In order to make the value of NZCirc decrease, during each iteration of processing the parity check matrix, a same part of the plurality of variable nodes related to the one or more shortened data bits may be skipped from estimation. The values with respect to the codeword estimated by the plurality of variable nodes and the plurality of check nodes may be iteratively updated according to the scheduler. The scheduler may indicate the amount of non-zero circulants in each layer of the parity check matrix, and the amount of non-zero circulants in each layer of the parity check matrix that correspond to the skipped variable nodes. The LDPC decoder 116 may sequentially retrieve the non-zero circulants in each layer of the parity check matrix based on the first value of the scheduler, and skip retrieving non-zero circulants corresponding to the one or more shortened data bits in each layer of the parity check matrix based on the second value of the scheduler. As a further example, the LDPC decoder 116 may sequentially retrieve the non-zero circulants in each layer of the parity check matrix based on the third value of the scheduler.

In some embodiments, the sequence (e.g., the sequence 903-*m* (m=1, 2, ..., n)) in the scheduler may include information indicating the order of processing the non-zero circulants in each layer, in which the processing of the non-zero circulants corresponding to the one or more shortened data bits may be shuffled to the end of the each layer. In some embodiments, the LDPC decoder 116 may skip processing the non-zero circulants in each layer of the parity check matrix corresponding to the one or more shortened data bits according to the sequence, the first value and the second value. In some embodiments, the LDPC decoder 116 may skip processing the non-zero circulants in each layer of the parity check matrix corresponding to the one or more shortened data bits according to the sequence and the third value. For example, as illustrated in FIG. 8, assuming that the variable nodes belonging to column 5 of the LDPC code matrix 800 correspond to the one or more shortened data bits. For layer 2, the first value which indicates the total number of non-zero circulants is five, the second value which indicates the number of non-zero circulants corresponding to the shortened data bit(s) is one, and/or the third value which indicates the number of non-zero circulants corresponding to the non-shortened data bit(s) or the parity bit(s) is four. When processing layer 2, the LDPC decoder 116 may firstly retrieve the non-zero circulants P(2, 1), P(2, 4), P(2, 7), and P(2, 8) in the natural column order or in any order according to the sequence. When the number of the non-zero circulants retrieved reaches four, the LDPC decoder 116 may determine that all the non-zero circulants that need to be processed have been retrieved according to the difference between the first value and the second value, or the third value. The non-zero circulant P(2, 5) may be skipped retrieving. The values estimated at the plurality of variable nodes corresponding to the non-zero circulants P(2, 1), P(2, 4), P(2, 7), and P(2, 8) may be sent to the corresponding check nodes, and in the next iteration, may be updated based on estimation passed back from the corresponding check nodes. Thus, when processing layer 2, the LDPC decoder 116 skip processing the non-zero circulant P(2, 5). Similarly, when processing layer 5, the LDPC decoder 116 may skip processing the non-zero circulant P(5, 5) as skipping processing non-zero circulant P(2,5) in layer 2.

By skipping processing the non-zero circulants related to the one or more shortened data bits in each iteration, the value of NZCirc may decrease. According to Equation (1), the decrease of the decoding throughput caused by the one or more shortened data bits may be eliminated. Merely by way of example, assuming that the number of the non-zero circulants skipped is 60, and other values in Equation (1) are the same as that of no skipping any non-zero circulants. The decoding throughput of the LDPC decoder 116 is calculated to be 329 MB/s, which is closer to the value 331 MB/s when there is no shortened user bit. Thus, the decoding throughput of the LDPC decoder 116 is improved.

In some cases, each of the one or more shortened data bits may be assigned with one in the codeword. During each iteration of decoding, each variable node from the same part of the plurality of variable nodes that corresponds to a non-zero circulant in a layer of the parity check matrix may be assigned with a constant value. For example, the constant value may be one.

In some embodiments, instead of storing an end-of-layer flag of the parity check matrix, the LDPC decoder 116 may save storage space by storing a first value which indicates the total number of non-zero circulants for each layer. Merely by way of example, the parity check matrix may include 1740 non-zero circulants arranged in 40 layers. For each non-zero circulant, the LDPC decoder 116 may need one bit of space to store its end-of-layer flag, and the LDPC decoder 116 needs 1740 bits of space to store all the end-of-layer flags. For each layer, the LDPC decoder 116 may need seven bits of space to store the first value, and the LDPC decoder 116 only needs 280 bits to store all the first values. Thus the LDPC decoder 116 may save 1460 bits of space when storing the first value instead of storing the end-of-layer flags for each layer.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the process 600 may include a storing operation for storing the codeword, the parity check matrix, and/or the values at the plurality of variable nodes and the plurality of check nodes during the decoding of the codeword.

FIG. 7-A and FIG. 7-B illustrate a flowchart illustrating an exemplary process 700 for decoding a codeword according to some embodiments of the present disclosure. The process 700 may be executed by the communication system 100. For example, the process 700 may be implemented by the LDPC decoder 116. In some embodiments, operation 606 of the process 600 in FIG. 6 may be implemented by performing one or more operations in the process 700.

In 702, the LDPC decoder 116 (e.g., the updater 506) may obtain a channel estimation with respect to a codeword as initial values of a plurality of variable nodes of a parity check matrix (e.g., the LDPC code matrix 800 illustrated in FIG. 8). In some embodiments, the LDPC decoder 116 may obtain the channel estimation along with the codeword from the demodulator 112 as illustrated in FIG. 1. The codeword may include a preset number of data bits. In some embodiments, the preset number of data bits may include one or more non-shortened data bits, one or more shortened data bits and one or more parity bits. During the encoding of the LDPC encoder 104, each shortened data bit may be assigned with a specific value. For example, all the shortened data bits may be assigned with zeros. As another example, all the shortened data bits may be assigned with ones. The channel estimation may include a plurality of values with respect to the data bits of the codeword. A value corresponding to each data bit of the codeword may indicate the likelihood that the each data bits is zero and/or the likelihood that the each data bit is one. The value may be represented in various ways, such as an absolute value, a probability value, an LLR value, etc. Each of the plurality of variable nodes of the parity check matrix may correspond to one data bit of the codeword. Each of the plurality of variable nodes may be assigned the corresponding value with respect to one data bit of the codeword as an initial value of each of the plurality of variable nodes. The codeword may include bit errors. The LDPC decoder 116 may use the parity check matrix to detect and correct the bit errors in the codeword. In some embodiments, the parity check matrix may include a plurality of layers, each corresponding to one or more check nodes of the parity check matrix. A layer of the parity check matrix may include a plurality of non-zero circulants. More descriptions of layers of the parity check matrix may found elsewhere in the present disclosure (e.g., FIG. 8 and the description thereof).

In 704, the LDPC decoder 116 (e.g., the updater 506) may sequentially retrieve non-zero circulants in each layer of the parity check matrix according to a scheduler. The scheduler may store a sequence (e.g., the sequence 903-$m$ ($m$=1, 2, ..., n) illustrated in FIG. 9) indicating the order of retrieving the non-zero circulants in each layer of the parity check matrix. In some embodiments, for each layer, the scheduler may store a first value indicating a first number of non-zero circulants in each layer of the parity check matrix. The LDPC decoder 116 may retrieve the non-zero circulants in each layer of the parity check matrix according to the first value and the retrieving order the scheduler. In some embodiments, for each layer, the scheduler may store a third value indicating a third number of non-zero circulants in each layer of the parity check matrix. Each of the third number of non-zero circulants may correspond to the one or more variable nodes that perform estimation during each iteration. The third number of non-circulants may be equal to the number of non-zero circulants to be processed in each layer and correspond to the one or more non-shortened data bits and the one or more parity bits. The LDPC decoder 116 may retrieve the non-zero circulants in each layer of the parity check matrix according to the third value and the retrieving order of the scheduler.

In 706, the LDPC decoder 116 (e.g., the updater 506) may determine whether there is one or more shortened data bits in the codeword.

In response to the determination that there is no shortened data bit in the codeword, the LDPC decoder 116 may execute the process 700 to operation 714 of FIG. 7-B via operation 713. Otherwise, in response to the determination that there is one or more shortened data bits in the codeword, the LDPC decoder 116 may execute the process 700 to operation 708.

In 708, the LDPC decoder 116 (e.g., the updater 506) may skip retrieving at least one non-zero circulant in each layer of the parity check matrix that corresponds to the one or more shortened data bits according to the scheduler. The scheduler may also store a second value indicating a second number of non-zero circulants in each layer of the parity check matrix in the scheduler. The second number of non-zero circulants may correspond to the one or more shortened data bits. The sequence of the scheduler may indicate the order of retrieving the non-zero circulants in each layer, in which the retrieving of the at least one non-zero circulant corresponding to the one or more shortened data bits may be shuffled to the end of each layer.

In some embodiments, when retrieving the non-zero circulants in each layer, the LDPC decoder 116 may retrieve the non-zero circulants in each layer according to the retrieving order (e.g., in natural column order or in any order) determined by the sequence, and the third value, which indicates the number of non-zero circulants corresponding to the non-shortened data bit(s) or parity bit(s), of the sequence. When the number of the non-zero circulants retrieved reaches the third value, the LDPC decoder 116 may determine that all the non-zero circulants need to be processed in each layer have been retrieved, and may not retrieve the at least one non-zero circulant corresponding to the one or more shortened data bits.

In some embodiments, when retrieving the non-zero circulants in each layer, the LDPC decoder 116 may retrieve the non-zero circulants in each layer according to the retrieving order (e.g., in natural column order or in any order) determined by the sequence, the first value and the second value of the scheduler. When the number of the non-zero circulants retrieved reaches the difference value between the first value and the second value, the LDPC decoder 116 may determine that all the non-zero circulants need to be processed in each layer have been retrieved, and may not retrieve the at least one non-zero circulant corresponding to the one or more shortened data bits.

The LDPC decoder 116 may proceed to node A 710 and perform at least some of operations starting from node A 710 illustrated in FIG. 7-B.

In 712, the LDPC decoder 116 (e.g., the updater 506) may estimate, by each check node, the values with respect to the codeword based on the retrieved non-zero circulants and prior values estimated by the plurality of variable nodes in a prior iteration. The values with respect to the codeword and the prior values may include a plurality of values with respect to the data bits of the codeword. A value or a prior value corresponding to corresponding to each data bit of the codeword may indicate the likelihood that the each data bit is zero and/or the likelihood that the each data bits is one. As used herein, an iteration may refer to a process of processing the parity check matrix from the first layer (i.e., the top layer) to the last layer (i.e., the bottom layer). The prior values may include the initial values assigned to the plurality of variable nodes at the beginning of the decoding.

During each iteration, when processing each layer, each of the plurality of variable nodes corresponding to the retrieved non-zero circulants may send a prior value to its edge-connected check nodes. In response, each check node may estimate and send values back to its edge-connected variable nodes. A check node may estimate the value at one of its edge-connected variable nodes based on values received from its other edge-connected variable nodes and its corresponding parity check equation.

In 714, the LDPC decoder 116 (e.g., the updater 506) may estimate, by each variable node, the values with respect to the codeword based on the values estimated by the plurality of check nodes. During each iteration, when processing each layer, each of the plurality of variable nodes corresponding to the retrieved non-zero circulants may estimate an updated value with respect to the corresponding data bit, based on the values estimated by and received from its edge-connected check nodes and the initial value obtained in operation 702.

In some embodiments, each of the one or more shortened data bits may be assigned with value "one" in the codeword. During each iteration, each variable node from the same part of the plurality of variable nodes that corresponds to a non-zero circulant in a layer of the parity check matrix may be assigned with a constant value. For example, the constant value may be one. Then, the assigned constant value(s), together with values at variable nodes which corresponds to non-zero circulant(s) and the non-shortened data bit(s) or parity bit(s), may be passed to the corresponding check node to estimate the values of the variable nodes which corresponds to non-zero circulant(s) and the non-shortened data bit(s) or parity bit(s). For example, the variable nodes which corresponds to the shortened data bits and non-zero circulants (also referred to as "the variable nodes corresponding to shortened circulants") may generate a specific value corresponding to the number of the variable nodes corresponding to shortened circulants. In some embodiments, the specific value may be expressed as $(-1)^k$, where k denotes the number of the variable nodes corresponding to shortened circulants. The corresponding check node may further estimate the values of the variable nodes which corresponds to non-zero circulant(s) and the non-shortened data bit(s) or parity bit(s) based on the specific value.

During each iteration, when the LDPC decoder 116 completes performing operations 712 and 714 for a current processing layer of the parity check matrix, the LDPC decoder 116 may vertically pass the updated values at the plurality of variable nodes corresponding to the retrieved non-zero circulants to the same variable nodes in the next unprocessed layer. During each iteration, the LDPC decoder 116 may sequentially process the layers of the parity check matrix from the first layer to the last layer.

In 716, the LDPC decoder 116 (e.g., the updater 506) may determine whether a predetermined number of iterations is met or whether the decoding converges. The decoding may converge when all parity check equations of the parity check matrix are satisfied by the bit values of the variable nodes (i.e., the syndrome of the codeword S is a null matrix). The predetermined number of iterations may be default settings of the communication system 100, or may be adjustable according to different situations.

In response to the determination that the predetermined number of iterations is not met and the decoding does not converge, the LDPC decoder 116 may execute operation 712, and repeat operations 712 and 714. The LDPC decoder 116 may further process the parity check matrix layer by layer in a new iteration.

In response to the determination that the predetermined number of iterations is met or the decoding converges, the LDPC decoder 116 may execute operation 718.

In 718, the LDPC decoder 116 may obtain a decoded codeword corresponding to the codeword. In each iteration, the LDPC decoder 116 may determine bit values for the plurality of variable nodes of the parity check matrix based on the values (e.g., LLR values) at the plurality of variable nodes. The final bit values of the plurality of variable nodes may be determined as the bit values of the decoded codeword. When the decoding converges, the decoded codeword may be a valid codeword.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the process 700 may include a storing operation for storing the codeword, the parity check matrix, and/or the values at the plurality of variable nodes and the plurality of check nodes during the decoding of the codeword. As another example, the LDPC decoder 116 (e.g., the updater 506) may determine whether the number of the shortened data bits in a codeword is greater than a threshold. The threshold may be default settings of the communication system 100, or may be adjustable under different situations. If the number of the shortened data bits is not greater than a threshold, the LDPC decoder 116 may obtain a certain parity check matrix for the codeword. The LDPC decoder 116 may further decode the codeword using the certain parity check matrix. Otherwise, if the number of the one or more is greater than the threshold, the LDPC decoder 116 may obtain another parity check matrix that is different from the certain parity check matrix to decode the codeword.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure and are within the spirit and scope of the exemplary embodiments of the present disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

I claim:

1. A method for decoding a low density parity check (LDPC) encoded codeword, the method comprising:
   receiving a codeword over a data channel, the codeword being encoded with a preset number of data bits having one or more shortened data bits;
   obtaining a parity check matrix, the parity check matrix defining relationships between a plurality of variable nodes and a plurality of check nodes, each variable node corresponding to one of the preset number of data bits; and
   decoding the codeword by iteratively estimating values with respect to the codeword at the plurality of variable nodes and the plurality of check nodes,
   wherein during each iteration, a same part of the plurality of variable nodes related to one or more shortened data bits are skipped from estimation.

2. The method of claim 1, wherein the parity check matrix includes a plurality of layers, each corresponding to one or more of the plurality of check nodes and having a plurality of non-zero circulants.

3. The method of claim 2, further comprising:
   storing a first value indicating a first number of non-zero circulants in each layer of the parity check matrix in a scheduler for decoding the codeword; and
   storing a second value indicating a second number of non-zero circulants in each layer of the parity check matrix in the scheduler, wherein the second number of non-zero circulants correspond to the one or more shortened data bits.

4. The method of claim 3, further comprising:
   sequentially retrieving the non-zero circulants in each layer of the parity check matrix based on the first value of the scheduler; and
   skipping retrieving the second number of non-zero circulants in each layer of the parity check matrix based on the second value of the scheduler.

5. The method of claim 2, further comprising:
   storing a third value indicating a third number of non-zero circulants in each layer of the parity check matrix in the scheduler, wherein each of the third number of non-zero circulants corresponds to one or more variable nodes that are estimated during each iteration.

6. The method of claim 5, further comprising:
   sequentially retrieving the non-zero circulants in each layer of the parity check matrix based on the third value of the scheduler.

7. The method of claim 2, wherein decoding the codeword by iteratively estimating values with respect to the data bits of the codeword at the plurality of variable nodes and the plurality of check nodes further comprises:
   sequentially retrieving the non-zero circulants in each layer of the parity check matrix;
   skipping retrieving at least one non-zero circulant in each layer of the parity check matrix that corresponds to the one or more shortened data bits; and
   iteratively updating, by the plurality of variable nodes and the plurality of check nodes, the values with respect to the codeword until a predetermined number of iterations is met or the decoded codeword converges.

8. The method of claim 7, further comprising:
obtaining a channel estimation with respect to the codeword as initial values of the plurality of variable nodes before executing the iterations.

9. The method of claim 1, wherein the values with respect to the codeword estimated by the plurality of variable nodes and the plurality of check nodes are iteratively updated according to a scheduler, the scheduler indicating the amount of non-zero circulants in each layer of the parity check matrix.

10. The method of claim 9, wherein the scheduler further indicates the amount of non-zero circulants in each layer of the parity check matrix that correspond to the skipped variable nodes.

11. The method of claim 9, wherein the each of the one or more shortened data bits is assigned with one in the codeword.

12. The method of claim 11, wherein:
during each iteration, each variable node from the same part of the plurality of variable nodes that corresponds to a non-zero circulant in a layer of the parity check matrix is assigned with a constant value.

13. The method of claim 1, wherein the each of the one or more shortened data bits is assigned with zero in the codeword.

14. A decoder for decoding a low density parity check (LDPC) encoded codeword, the decoder comprising:
a receiving module configured to receive a codeword over a data channel, the codeword being encoded with a preset number of data bits having one or more shortened data bits;
a memory; and
an updater configured to:
obtain a parity check matrix from the memory, the parity check matrix defining relationships between a plurality of variable nodes and a plurality of check nodes, each variable node corresponding to one of the preset number of bits; and
decode the codeword by iteratively estimating values with respect to the codeword at the plurality of variable nodes and the plurality of check nodes,
wherein during each iteration, a same part of the plurality of variable nodes related to one or more shortened data bits are skipped from estimation.

15. The decoder of claim 14, wherein the parity check matrix includes a plurality of layers, each corresponding to one or more of the plurality of check nodes and having a plurality of non-zero circulants.

16. The decoder of claim 15, wherein the memory further includes a scheduler configured to:
store a first value indicating a first number of non-zero circulants in each layer of the parity check matrix in the scheduler for decoding the codeword; and
store a second value indicating a second number of non-zero circulants in each layer of the parity check matrix in the scheduler, wherein the second number of non-zero circulants correspond to the one or more shortened data bits.

17. The decoder of claim 16, wherein the updater is further configured to:
sequentially retrieve the non-zero circulants in each layer of the parity check matrix based on the first value of the scheduler; and
skip retrieving the second number of non-zero circulants in each layer of the parity check matrix based on the second value of the scheduler.

18. The decoder of claim 15, wherein the memory further includes a scheduler configured to:
store a third value indicating a third number of non-zero circulants in each layer of the parity check matrix in the scheduler, wherein each of the third number of non-zero circulants corresponds to one or more variable nodes that are estimated during each iteration.

19. The decoder of claim 18, wherein the updater is further configured to:
sequentially retrieve the non-zero circulants in each layer of the parity check matrix based on the third value of the scheduler.

20. The decoder of claim 15, wherein to decode the codeword by iteratively estimating values with respect to the data bits of the codeword at the plurality of variable nodes and the plurality of check nodes, the updater is further configured to:
sequentially retrieve the non-zero circulants in each layer of the parity check matrix;
skip retrieving at least one non-zero circulant in each layer of the parity check matrix that corresponds to the one or more shortened data bits; and
iteratively update, by the plurality of variable nodes and the plurality of check nodes, the values with respect to the codeword until a predetermined number of iterations is met or the decoded codeword converges.

* * * * *